(12) United States Patent
Shin et al.

(10) Patent No.: US 8,030,844 B2
(45) Date of Patent: Oct. 4, 2011

(54) FLAT PANEL DISPLAY AND METHOD OF MANUFACTURING THE SAME

(75) Inventors: Hyun-Soo Shin, Suwon-si (KR);
Jae-Bon Koo, Suwon-si (KR);
Yeon-Gon Mo, Suwon-si (KR);
Jae-Kyeong Jeong, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 705 days.

(21) Appl. No.: 11/407,018

(22) Filed: Apr. 19, 2006

(65) Prior Publication Data
US 2007/0007893 A1    Jan. 11, 2007

(30) Foreign Application Priority Data
Jul. 6, 2005 (KR) .................. 10-2005-0060718

(51) Int. Cl.
*H01L 51/00* (2006.01)
*H01L 51/50* (2006.01)
*H01L 51/52* (2006.01)
*H01L 51/56* (2006.01)
*H01J 9/26* (2006.01)
*H01J 9/32* (2006.01)

(52) U.S. Cl. ........ 313/511; 313/506; 313/509; 313/512; 445/24; 445/25

(58) Field of Classification Search .......... 313/498–512; 445/24–25
See application file for complete search history.

(56) References Cited

U.S. PATENT DOCUMENTS

| | | | | |
|---|---|---|---|---|
| 4,339,482 A * | 7/1982 | Glaser et al. | ..................... | 428/13 |
| 4,510,195 A * | 4/1985 | Iida et al. | ..................... | 428/215 |
| 4,695,490 A * | 9/1987 | McClelland et al. | ........ | 428/1.53 |
| 5,610,742 A * | 3/1997 | Hinata et al. | .................. | 349/122 |
| 5,757,126 A | 5/1998 | Harvey, III et al. | | |
| 6,219,127 B1 * | 4/2001 | Hirakata et al. | .............. | 349/153 |
| 6,274,887 B1 * | 8/2001 | Yamazaki et al. | .............. | 257/72 |
| 6,355,125 B1 | 3/2002 | Tahon et al. | | |
| 6,362,507 B1 | 3/2002 | Ogawa et al. | | |
| 6,576,351 B2 * | 6/2003 | Silvernail | ...................... | 428/690 |
| 6,605,826 B2 * | 8/2003 | Yamazaki et al. | .............. | 257/72 |
| 6,606,184 B2 * | 8/2003 | Guarr et al. | ................... | 359/265 |
| 6,720,203 B2 * | 4/2004 | Carcia et al. | ..................... | 438/99 |
| 7,038,378 B2 * | 5/2006 | Hayashi | ............................ | 313/512 |
| 7,112,115 B1 * | 9/2006 | Yamazaki et al. | .............. | 445/25 |
| 7,189,999 B2 * | 3/2007 | Yamazaki et al. | .............. | 257/72 |
| 7,291,970 B2 * | 11/2007 | Kuwabara | ..................... | 313/504 |
| 7,368,307 B2 * | 5/2008 | Cok | ............................... | 438/26 |

(Continued)

FOREIGN PATENT DOCUMENTS

JP    06-075209    3/1994

(Continued)

*Primary Examiner* — Nimeshkumar Patel
*Assistant Examiner* — Jose M Diaz
(74) *Attorney, Agent, or Firm* — Knobbe Martens Olson & Bear LLP

(57) ABSTRACT

Provided is a flat panel display which has improved flexibility by using a metal substrate or a conductive substrate, wherein the substrate is protected from external exposure. Also provided is a method of manufacturing the flat panel display. The flat panel display includes a substrate, a first insulator with which one surface of the substrate is covered, a display unit disposed on the other surface of the substrate, and a second insulator with which edges of the substrate are covered to prevent exposure.

21 Claims, 6 Drawing Sheets

U.S. PATENT DOCUMENTS

| | | | |
|---|---|---|---|
| 7,417,253 B2* | 8/2008 | Yamazaki et al. | 257/72 |
| 7,535,547 B2* | 5/2009 | Tannas, Jr. | 349/190 |
| 7,567,028 B2* | 7/2009 | Park et al. | 313/504 |
| 2003/0082889 A1* | 5/2003 | Maruyama et al. | 438/455 |
| 2003/0116764 A1 | 6/2003 | Fujikawa et al. | |
| 2003/0178937 A1 | 9/2003 | Mishima | |
| 2003/0193286 A1* | 10/2003 | Ottermann et al. | 313/506 |
| 2004/0012747 A1* | 1/2004 | Yamazaki et al. | 349/153 |
| 2004/0036411 A1* | 2/2004 | Kim et al. | 313/506 |
| 2004/0046909 A1* | 3/2004 | Sekiguchi | 349/113 |
| 2004/0087066 A1 | 5/2004 | Voutsas | |
| 2004/0212012 A1* | 10/2004 | Yamazaki et al. | 257/347 |
| 2005/0001547 A1 | 1/2005 | Yamazaki et al. | |
| 2005/0017268 A1 | 1/2005 | Tsukamoto et al. | |
| 2005/0140260 A1* | 6/2005 | Park et al. | 313/292 |
| 2005/0195488 A1* | 9/2005 | McCabe et al. | 359/603 |
| 2005/0205868 A1* | 9/2005 | Yamazaki et al. | 257/72 |
| 2005/0236985 A1* | 10/2005 | Handa et al. | 313/511 |
| 2007/0222370 A1* | 9/2007 | Zhu et al. | 313/504 |

FOREIGN PATENT DOCUMENTS

| | | |
|---|---|---|
| JP | 08-124676 | 5/1996 |
| JP | 09-161967 | 6/1997 |
| JP | 09-330793 | 12/1997 |
| JP | 2000-332306 | 11/2000 |
| JP | 2001-007343 | 1/2001 |
| JP | 2001-223073 | 8/2001 |
| JP | 2002-117971 | 4/2002 |
| JP | 2002-151253 | 5/2002 |
| JP | 2002-214587 | 7/2002 |
| JP | 2002-324667 | 11/2002 |
| JP | 2003-186047 | 7/2003 |
| JP | 2003-282258 | 10/2003 |
| JP | 2004-354648 | 12/2004 |
| KR | 10-2006-0059080 | 6/2006 |
| WO | WO 03/023745 | 3/2003 |

* cited by examiner

FLAT PANEL DISPLAY AND METHOD OF MANUFACTURING THE SAME

CROSS-REFERENCE TO RELATED PATENT APPLICATION

This application claims the benefit of Korean Patent Application No. 10-2005-0060718, filed on Jul. 6, 2005, in the Korean Intellectual Property Office, the disclosure of which is incorporated herein in its entirety by reference.

BACKGROUND OF THE INVENTION

1. Field of the Invention

The present invention relates to a flat panel display and a method of manufacturing the same, and more particularly, to a flat panel display which provides improved flexibility by using a metal substrate or a conductive substrate which is protected from exposure to ambient conditions. Also presented is a method of manufacturing the flat panel display.

2. Description of the Related Technology

Typical flat panel displays, such as, organic electroluminescent displays, TFT-LCDs, etc., can be thin and flexible. Hence, much research into flat panel displays has been performed to improve flexibility and thinness.

To be thin and flexible, flat panel displays use a flexible substrate. The flexible substrate is generally made of synthetic resin. Flat panel displays include various elements, such as, an organic film, a thin film transistor, electrodes, or an orientation film. These elements are formed under various process conditions. When the flexible substrate is made of synthetic resin, the process may result in the flexible substrate being deformed or in a thin film formed on the substrate being deformed.

To overcome this problem, a technique of forming a flexible substrate of metal foil instead of synthetic resin is under study.

This metal foil substrate is suitable for top-emission type flat panel displays in which light generated in a display unit is emitted in a direction away from the flexible substrate. In addition, a metal foil substrate is less sensitive to the process conditions than a conventional substrate. For example, the metal foil substrate can relatively freely undergo a high-temperature process for crystallizing amorphous silicon into polycrystalline silicon without suffering damage. U.S. Patent Publication No. 2004/0,087,066 discloses an active matrix (AM) organic electroluminescent display using a metal foil substrate.

Since the metal foil substrate is an electrical conductor, the metal foil substrate should not be exposed to the environment after final assembly of the display device. The surface of the metal foil substrate opposite to where the display unit is formed can be prevented from being exposed by being covered with an insulator. However, in mass production, many display devices are simultaneously manufactured by forming many display units on a single metal substrate and then cutting the metal substrate. Although the metal substrate is covered with an insulator beforehand, the cutting process exposes portions of the metal substrate around the periphery of the display. Because of these exposed portions, static electricity affects the display units, thus degrading the quality and durability of the display devices.

SUMMARY OF CERTAIN INVENTIVE EMBODIMENTS

The present invention provides a flat panel display which has improved flexibility by using a metal substrate or a conductive substrate, wherein the substrate is protected from external exposure to the external environment. Also presented is a method of manufacturing the flat panel display.

One embodiment includes a flat panel display including a substrate, a first insulator covering a first surface of the substrate, a display unit on a second surface of the substrate, and a second insulator covering edges of the substrate so as to substantially prevent exposure of the edges of the substrate to ambient conditions.

Another embodiment includes a method of manufacturing a flat panel display. The method includes covering a first surface of a metal substrate with a first insulator, disposing a display unit on a second surface of the substrate, and cutting the metal substrate along a path encompassing the display unit. The cutting exposes an edge of the substrate. The method also includes covering the exposed edge of the cut substrate with a second insulator.

Another embodiment includes a flat panel display including a flexible conductive substrate having first and second surfaces and one or more peripheral edges, a display unit on the first surface, and an insulator covering the at least one of the one or more peripheral edges.

BRIEF DESCRIPTION OF THE DRAWINGS

The above and other features and advantages of certain inventive aspects are discussed with further detailed exemplary embodiments with reference to the attached drawings in which.

DETAILED DESCRIPTION OF CERTAIN INVENTIVE EMBODIMENTS

Certain inventive embodiments will now be described more fully with reference to the accompanying drawings.

Figure 1:
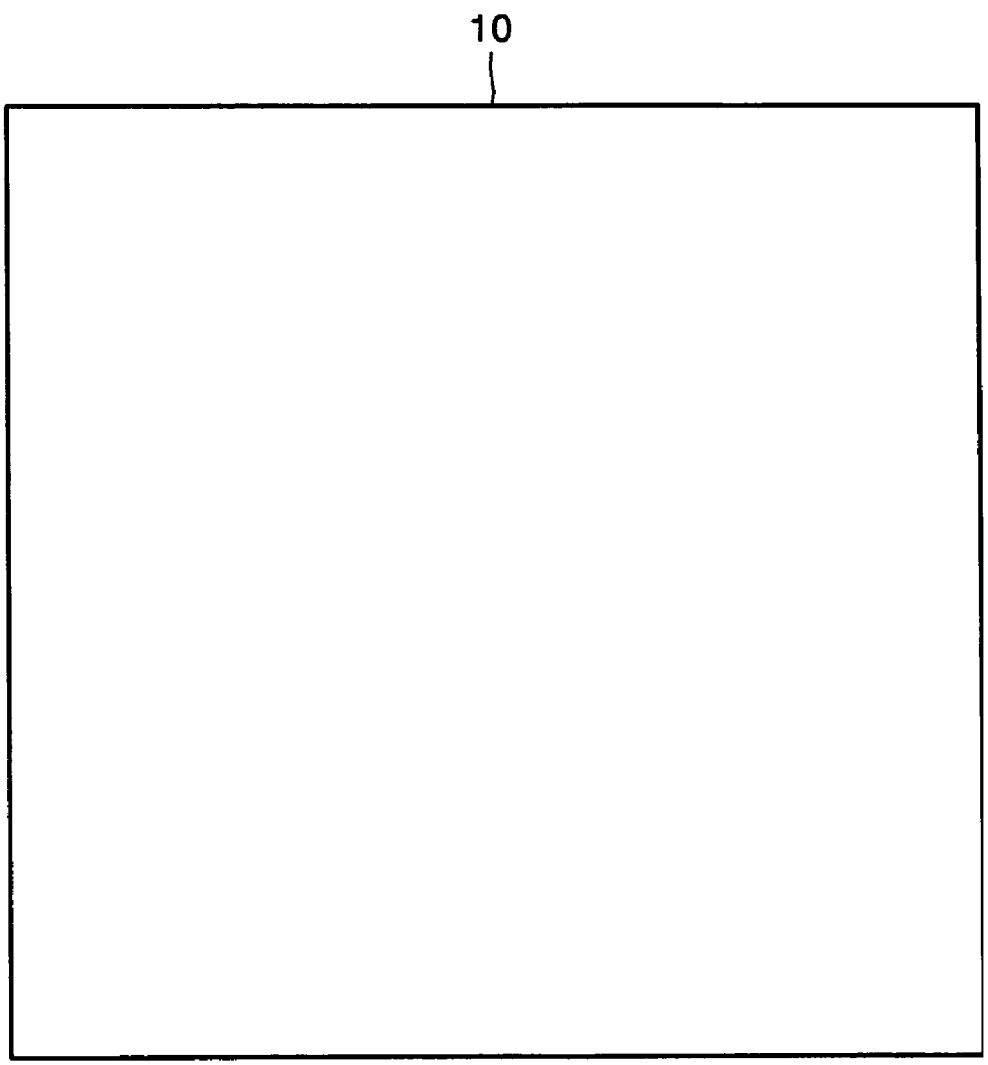
FIGS. 1 through 6 are schematic plan views and schematic cross-sectional views illustrating a method of manufacturing a flat panel display according to an embodiment.
Figure 2:
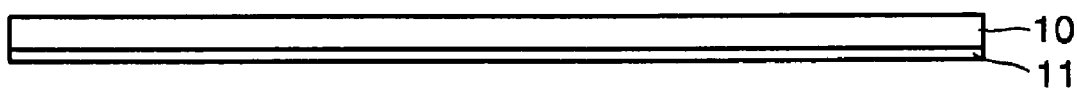

FIGS. 1 through 6 are schematic plan views and schematic cross-sectional views for illustrating a method of manufacturing a flat panel display according to an embodiment of the present invention. As shown in FIGS. 1 and 2, a flat panel display is manufactured using a metal substrate 10. The metal substrate 10 may be formed of metal foil which may include at least one material of stainless steel, Ti, Mo, Invar alloy, Inconel alloy, and Kovar alloy. Preferably, a surface of the metal substrate 10 is cleaned and then planarized. The planarization may be executed using a chemical mechanical polishing (CMP) method.

A first insulator 11 is formed on one surface of the metal substrate 10. In a final flat panel display, the first insulator 11 prevents the surface of the metal substrate 10 from being exposed. The first insulator 11 may be formed of an organic material or an inorganic material. The inorganic material may include at least one of silicon oxide, silicon nitride, silicon oxynitride, titanium oxide, aluminum oxide, and a compound of two or more of these materials. The organic material may include at least one of PI, Parylene, PMMA, Epoxy, PS, PE, PP, PTFE, PPS, PC, PET, PVC, BCB, PVP, PAN, PVA, Phenolic resin, and CVPE.

Figure 3:
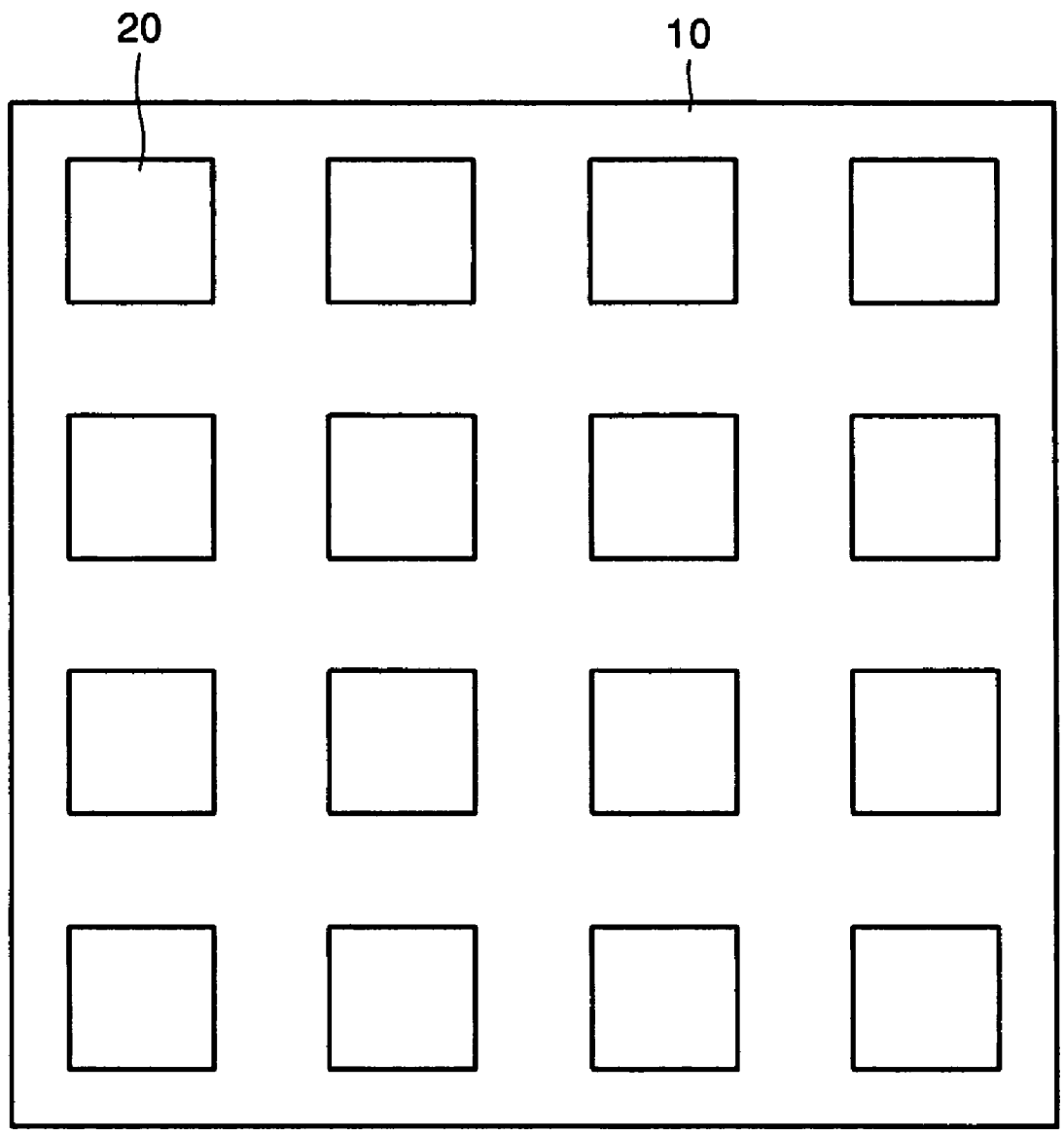

Thereafter, as shown in FIG. 3, a number of display units 20 are formed on the other surface of the metal substrate 10. The display units 20 may be various devices, such as, electroluminescent devices, electron emitting devices, liquid crystal devices, etc. When being used in a flexible display device as described above, forming display units on a metal substrate is highly efficient. In some embodiments, electroluminescent devices may be used as the display units 20 to manufacture a flexible flat panel display.

A structure of an electroluminescent device will now be described briefly.

The electroluminescent device includes various pixels according to the colors produced by a light emitting layer. For example, the electroluminescent device may include red pixels, green pixels, and blue pixels. The electroluminescent device, which is a current driving type light-emitting device, produces an image by emitting red, green, or blue light generated by a current flowing between the electrodes of the electroluminescent device.

An electroluminescent device includes a first electrode, an intermediate layer including at least a light emitting layer. The intermediate layer is formed over the first electrode, and a second electrode is formed over the intermediate layer. Other embodiments of electroluminescent devices may also be used.

The first and second electrodes serve as an anode electrode and a cathode electrode, respectively. Of course, the first and second electrodes may also serve as a cathode electrode and an anode electrode, respectively.

The first electrode may be a transparent electrode or a reflective electrode. When the first electrode is a transparent electrode, the first electrode may be formed of at least one of ITO, IZO, ZnO, or $In_2O_3$. Other materials may also be used. When the first electrode is a reflective electrode, the first electrode may be formed by forming a reflective layer of Ag, Mg, Al, Pt, Pd, Au, Ni, Nd, Ir, Cr, or a compound of two or more of these materials. Other materials may also be used. An ITO layer, an IZO layer, a ZnO layer, or an $In_2O_3$ layer may be formed on the reflective layer. In passive matrix (PM) flat panel displays, the first electrode may be patterned into strips separated from each other at predetermined intervals using a process such as photolithography. In active matrix (AM) flat panel displays, the first electrode may be formed in a pattern corresponding to a pattern of pixels. In AM flat panel displays, a thin film transistor (TFT) layer including at least one TFT is further disposed between the first electrode and a substrate, and the first electrode is electrically connected to the TFT layer.

The second electrode may be a transparent electrode or a reflective electrode. When the second electrode is a transparent electrode, the second electrode may serve as a cathode electrode and be formed by depositing Li, Ca, LiF/Ca, LiF/Al, Al, Ag, Mg, or a compound of two or more of these materials on the intermediate layer. Other materials may also be used. Auxiliary electrode or bus electrode lines for the transparent electrode may be formed by subsequently depositing materials, such as, ITO, IZO, ZnO, or $In_2O_3$. When the second electrode is a reflective electrode, the second electrode may be formed by depositing Li, Ca, LiF/Ca, LiF/Al, Al, Ag, Mg, or a compound of two or more of these materials on the entire surface of the intermediate layer. Other materials may also be used. Formation of the first and second electrodes are not limited to the above-described methods. The first and second electrodes may also be formed of an organic material, such as a conductive polymer, etc.

In PM flat panel displays, the second electrode may be patterned into strips perpendicular to strips of the first electrode. In AM flat panel displays, the second electrode may be formed to cover all pixels or formed in a pattern corresponding to a pattern of pixels.

The intermediate layer between the first and second electrodes has a light emitting layer that emits light based on current between the first and second electrodes. Depending on the type of an intermediate layer, electroluminescent devices may be classified into organic electroluminescent devices or inorganic electroluminescent devices.

In some embodiments, an intermediate layer may be formed of a low-molecular weight organic material or a polymer organic material.

When the intermediate layer is formed of a low-molecular weight organic material, the intermediate layer may be a stack of a hole injection layer (HIL), a hole transport layer (HTL), an emission layer (EML), an electron transport layer (ETL), and an electron injection layer (EIL). Alternatively, the intermediate layer may be a single layer that performs functions of the HIL, HTL, EML, ETL, and EIL. Examples of the low-molecular weight organic material include: copper phthalocyanine (CuPc); N, N'-Di(naphthalene-1-yl)-N,N'-diphenyl-benzidine (NPB); tris-8-hydroxyquinoline aluminum (Alq3), etc. The low-molecular weight organic intermediate layer may be formed by heating and evaporating an organic material in a vacuum. The structure of the low-molecular weight organic intermediate layer is not limited to the above-described structure, but may alternatively be comprised of various other layers.

When the intermediate layer is formed of a polymer organic material, it may include an HTL and an EML. In this case, the HTL may be formed of poly-(2,4)-ethylene-dihydroxy thiophene (PEDOT) or polyaniline (PANI) by inkjet printing or spin coating, and the EML may be formed of poly-phenylenevinylene (PPV), soluble PPV's, Cyano-PPV, or polyfluorene. A color pattern may be formed on the EML using a method, such as, but not limited to inkjet printing, spin coating, or laser-induced thermal imaging. The structure of the polymer organic intermediate layer is not limited to the above-described structure. The intermediate layer may be comprised of various layers other than the above-described layers in some cases.

In inorganic electroluminescent devices, the intermediate layer is formed of an inorganic material. The inorganic intermediate layer may include an EML and an insulative layer interposed between the EML and the electrodes. Of course, a structure of the inorganic intermediate layer is not limited to the above-described structure. The inorganic intermediate layer may also comprise various layers other than the above-described layers in some cases. The EML may be formed of a metal oxide (e.g., ZnS, SrS, CaS, etc.), an alkaline earth metal (e.g., $CaCa_2S_4$, $SrGa_2S_4$, etc.), a transfer metal (e.g., Mn, Ce, Tb, Eu, Tm, Er, Pr, Pb, etc.), or an alkaline rare earth metal. Other materials may also be used.

Figure 4:
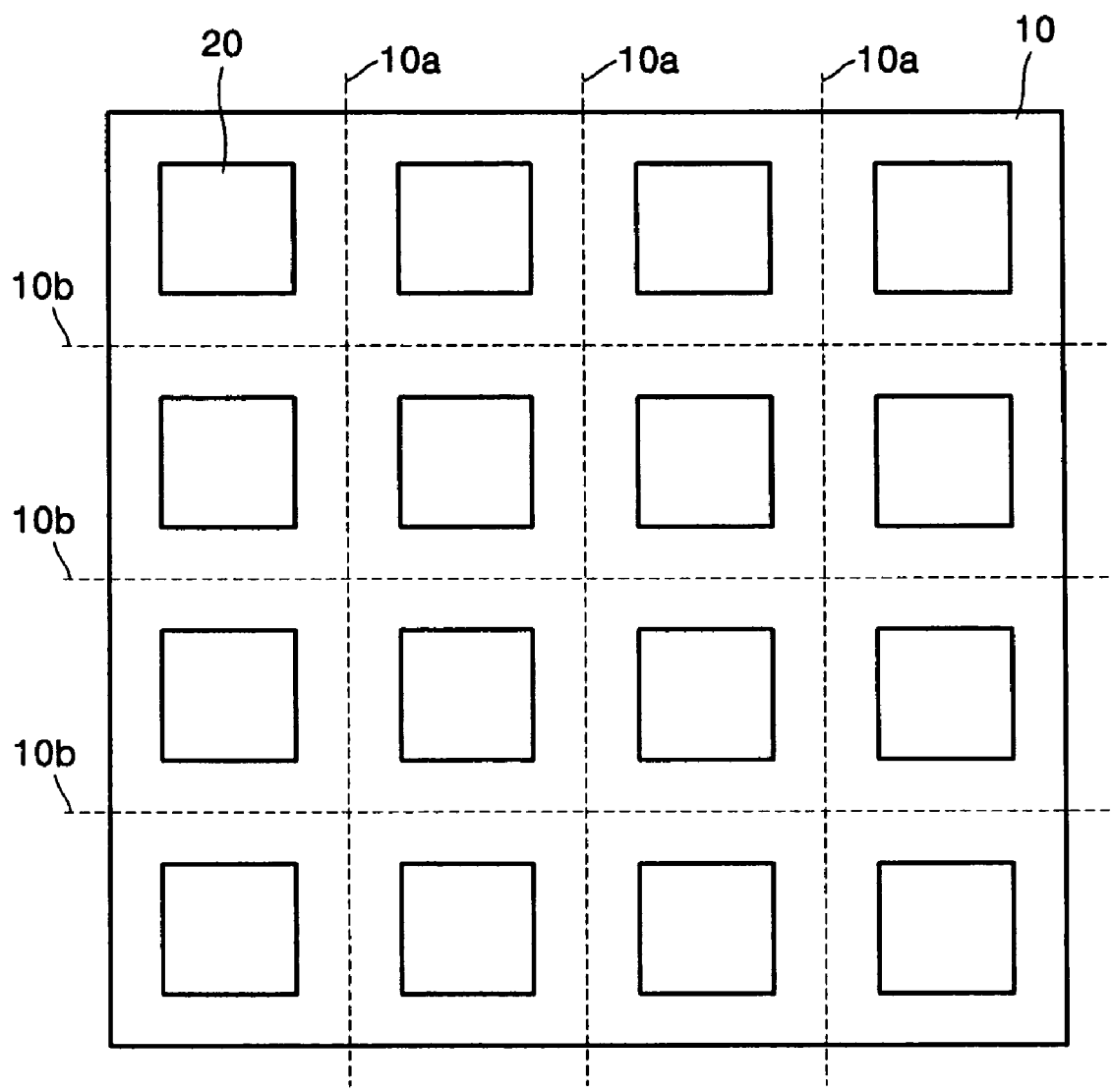

After the display units 20 are manufactured as described above, the metal substrate 10 is cut along outer peripheries of the display units 20 to produce a plurality of display panels. As shown in FIG. 4, the metal substrate 10 is cut along the dotted lines 10a and 10b.

Figure 5:
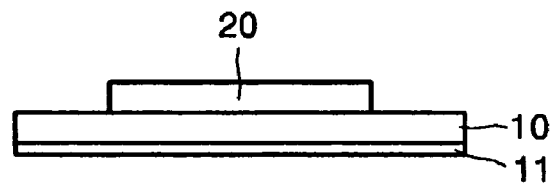

FIG. 5 illustrates a display panel obtained by cutting the metal substrate 10. Since the edges of a segment of the metal substrate 10 are exposed by cutting, the edges are subsequently covered with a second insulator 12 as shown in FIG. 6.

The second insulator 12 may also be formed of an organic material or an inorganic material. The inorganic material may include at least one of silicon oxide, silicon nitride, silicon oxynitride, titanium oxide, aluminum oxide, and a compound of two or more of these materials. The organic material may include at least one of PI, Parylene, PMMA, Epoxy, PS, PE, PP, PTFE, PPS, PC, PET, PVC, BCB, PVP, PAN, PVA, Phenolic resin, and CVPE.

Figure 6:
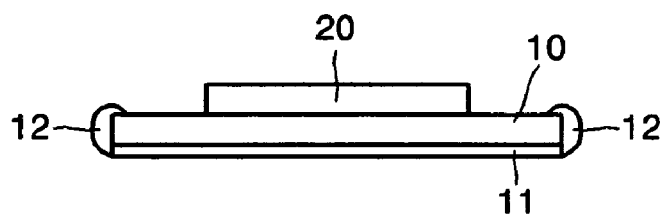

In FIG. 6, a portion at the outer perimeter of the surface of the metal substrate 10 on which a display unit 20 is formed is exposed, The exposed portion will be covered by the cell phone or other apparatus to which flat panel display is attached.

Figure 7:
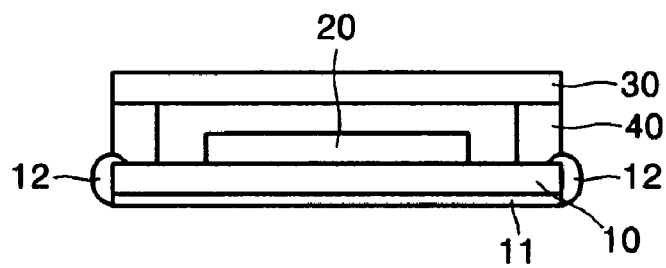
FIG. 7 is a schematic cross-sectional view of a modification of the flat panel display shown in FIG. 6.

In some embodiments, such a flat panel display may itself serve as an independent display device without being combined with another apparatus. FIG. 7 illustrates such a flat panel display functioning as an independent display device.

As shown in FIG. 7, an opposite element 30 may be attached to each segment of the metal substrate 10 with a sealant 40 placed on a surface of display unit 20. In particular, when the display unit 20 is implemented as an electroluminescent device as described above, the use of the opposite element 30 is desirable to seal the electroluminescent device which is very vulnerable to external humidity, oxygen, etc. In this case, the opposite element 30 may include a getter for removing external humidity, oxygen, etc. Since light emitted from the display unit 20 should be discharged through the opposite element 30 instead of the metal substrate 10, the opposite element 30 is preferably transparent.

When a flat panel display does not include an opposite element as shown in FIG. 6, various changes may be made to the second insulator 12 to prevent the metal substrate 10 from being exposed. For example, the second insulator 12 may extend to cover the surface of the metal substrate 10 that is adjacent to the display unit 20.

In this case, the metal substrate 10 is prevented from being exposed, so that the flexibility of the metal substrate 10 is kept and damage to the display unit 20 due to external static electricity, etc. is prevented.

Figure 8:
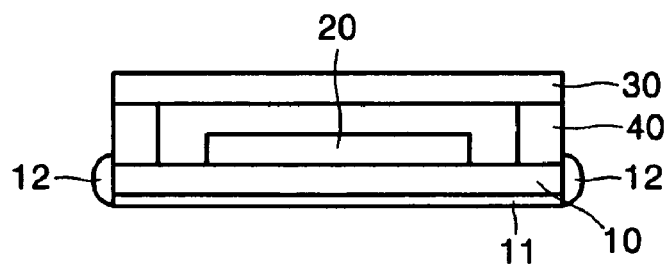
FIG. 8 is a schematic cross-sectional view of another modification of the flat panel display shown in FIG. 6.
Figure 9:
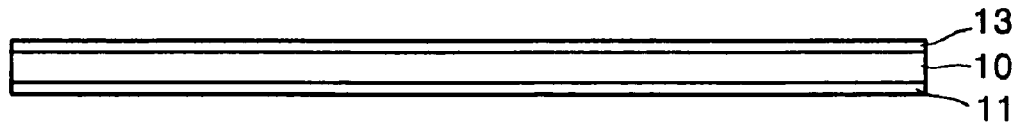
FIGS. 9 through 12 are schematic plan views and schematic cross-sectional views for illustrating a method of manufacturing a flat panel display according to another embodiment.

The second insulator 12 may be formed before or after the opposite element 30 is formed. FIG. 8 illustrates such a flat panel display obtained by forming the second insulator 12 before attaching the opposite element 30.

Thus far discussion has been directed towards a metal substrate. This is not meant to be limiting. When other materials are used for the substrate, the structure and methods described herein will be effective in these embodiments, as well.

FIGS. 9 through 12 are schematic plan views and schematic cross-sectional views for illustrating a method of manufacturing a flat panel display according to another embodiment. In this embodiment a third insulator 13 is formed on the surface of the metal substrate 10 where display units 20 are to be formed. The display units 20 are subsequently formed on the third insulator 13.

Since the metal substrate 10 is an electrical conductor, if the metal substrate 10 needs to be insulated from the display unit 20 formed thereon, the third insulator 13 should be formed on the metal substrate 10 in advance. In some embodiments, the metal substrate 10 should be electrically insulated from other components of the display unit 10. In this case, the third insulator 13 is advantageous. The third insulator 13 is also prevents the metal of the substrate 10 from being diffused into the display unit 20.

In some embodiments, the first and third insulators 11 and 13 may be formed through different processes or through a single process. For example, the first and third insulators 11 and 13 may be formed simultaneously using a dipping method. In this case, the first and third insulators 11 and 13 are formed of an identical material.

Figure 10:
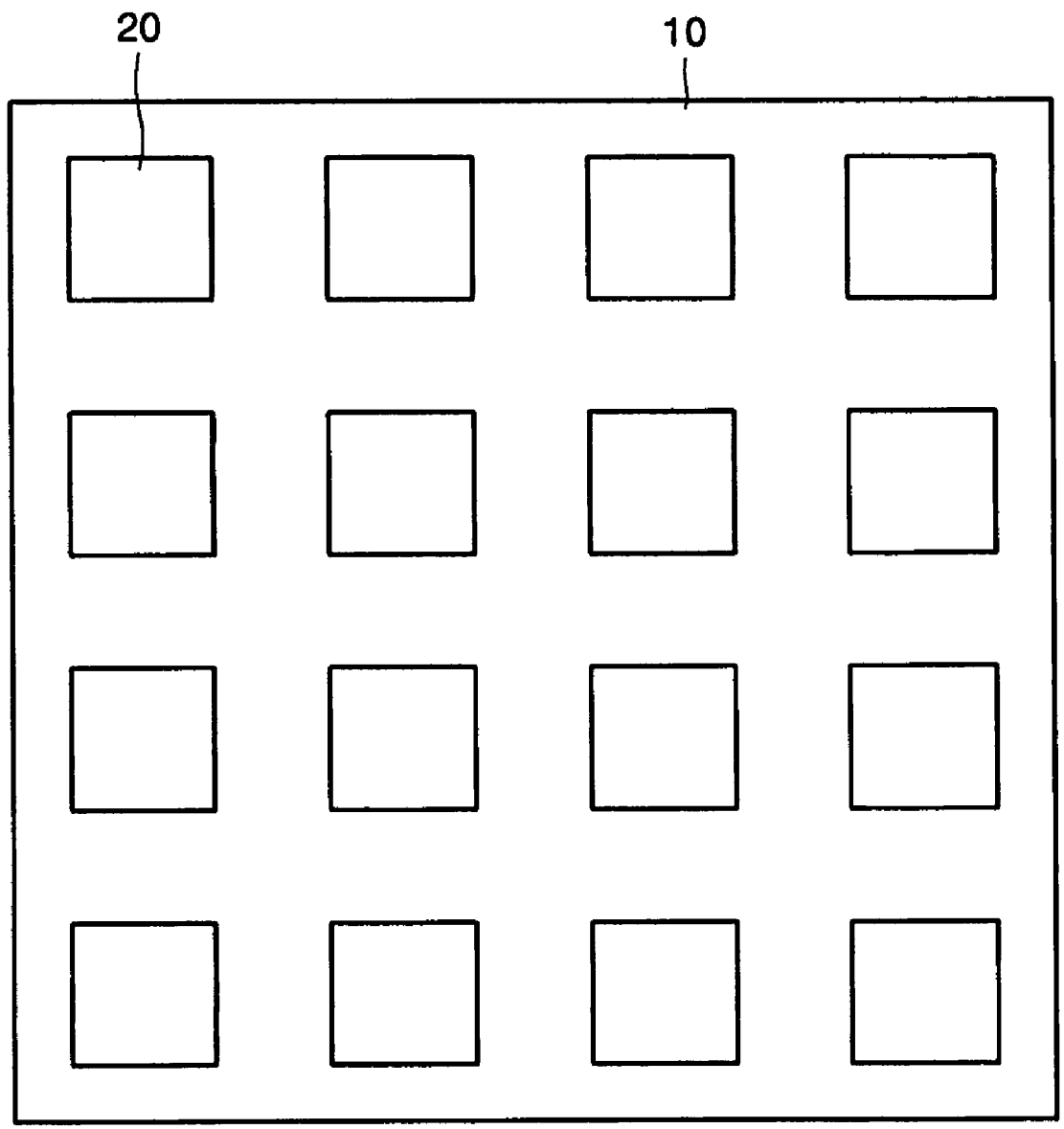
Figure 11:
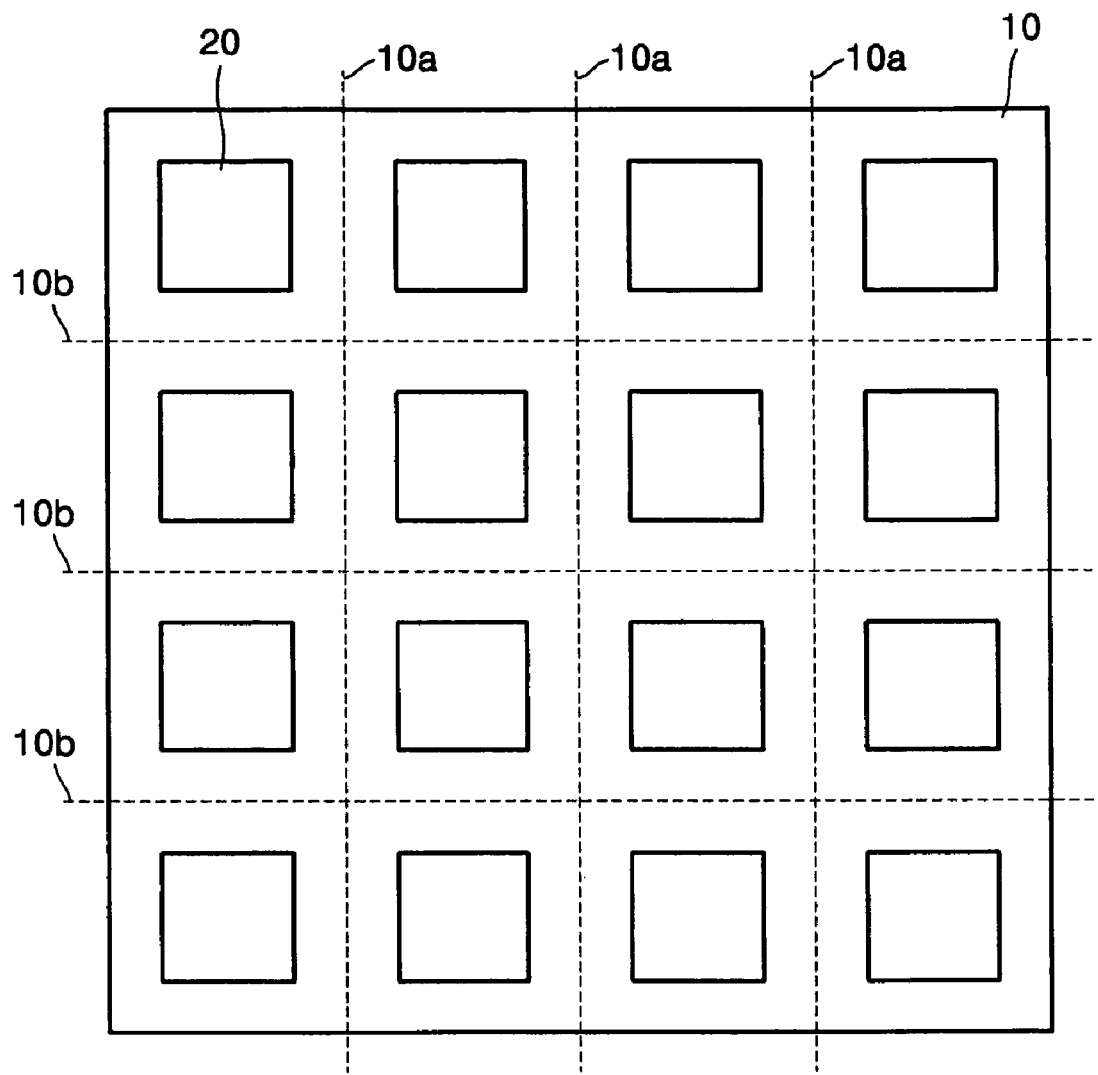

Thereafter, as shown in FIG. 10, a number of display units 20 are formed on the third insulator 13. Next, as shown in FIG. 11, the metal substrate 10 is cut dotted lines 10a and 10b, to produce a number of display panels.

Figure 12:
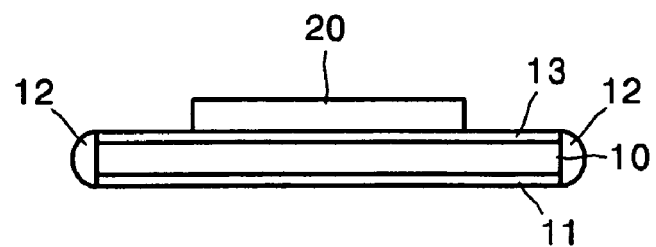

Because of the cutting of the metal substrate 10, the edges of the metal substrate 10 are exposed. To cover this exposure, a second insulator 12 is formed on the edges of the metal substrate 10, as shown in FIG. 12. The materials and other features of the first and second insulators 11 and 12 may be the same as those mentioned above.

Although not shown, further inclusion of an opposite element as described in the above embodiment and other various modifications may be advantageous.

Although an electroluminescent display device in which a display unit is an electroluminescent device has been illustrated in the embodiments and modifications, the present invention is not limited to the electroluminescent display device. For example, the display unit may be a liquid crystal device or an electron emission device. Thus far discussion has been directed towards a display with an electroluminescent display device. This is not meant to be limiting. When other types of display devices are used, such as liquid crystal displays or electron emission devices, the structure and methods described herein will be effective in these embodiments, as well.

A flat panel display according to the embodiments described above and a method of manufacturing the same provide the following effects. First, the flat panel display can be easily manufactured despite using a high temperature process by using a metal substrate or a conductive substrate.

Second, due to the use of the metal substrate or the conductive substrate, the flexibility of the flat panel display improves.

Third, due to the elimination of external exposure of the metal substrate or conductive substrate, a display unit is protected from external electrical impacts, such as static electricity, so that the quality and durability of the flat panel display is drastically increased.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A flat panel display comprising:
   a first substrate;
   a first insulator covering a first surface of the first substrate;
   a display unit on a second surface of the first substrate;
   a second substrate connected to the first substrate, wherein the display unit is between the first and second substrates, and wherein the second substrate is exposed to ambient conditions;
   a second insulator contacting only the first substrate of the first and second substrates, and covering and directly contacting side edges of the first substrate without covering one or more edges of the second substrate,
   wherein the first substrate is not exposed to the ambient conditions at least partly due to the first and second insulators.

2. The flat panel display of claim 1, further comprising a third insulator covering the second surface of the first substrate, wherein the display unit is formed on the third insulator.

3. The flat panel display of claim 1, wherein the first insulator and the third insulator are formed of an identical material.

4. The flat panel display of claim 1, wherein the second insulator comprises an inorganic material.

5. The flat panel display of claim 4, wherein the second insulator comprises at least one of silicon oxide, silicon nitride, silicon oxynitride, titanium oxide, and aluminum oxide.

6. The flat panel display of claim 1, wherein the second insulator comprises an organic material.

7. The flat panel display of claim 6, wherein the second insulator comprises at least one of PI, Parylene, PMMA, Epoxy, PS, PE, PP, PTFE, PPS, PC, PET, PVC, BCB, PVP, PAN, PVA, Phenolic resin, and CVPE.

8. The flat panel display of claim 1, wherein the first substrate comprises metal.

9. The flat panel display of claim 8, wherein the metal substrate comprises at least one of stainless steel, Ti, and Mo.

10. The flat panel display of claim 1, wherein the display unit is an electroluminescent device.

11. A method of manufacturing a flat panel display, the method comprising:
   covering a first surface of a metal substrate with a first insulator;
   disposing a plurality of display units on a second surface of the substrate;
   producing a plurality of display panels by cutting the metal substrate along a path encompassing each of the display units, wherein the cutting exposes an edge of the substrate;
   covering the exposed edge of the cut metal substrate with a second insulator without covering one or more edges of a second substrate connected to the cut metal substrate, wherein the display unit is between the cut metal substrate and the second substrate.

12. The method of claim 11, further comprising covering the second surface of the metal substrate with a third insulator, wherein the display units are disposed on the third insulator.

13. The method of claim 12, wherein covering the first and second surfaces is performed substantially simultaneously.

14. The method of claim 11, wherein the second insulator comprises an inorganic material.

15. The method of claim 14, wherein the second insulator comprises at least one of silicon oxide, silicon nitride, silicon oxynitride, titanium oxide, and aluminum oxide.

16. The method of claim 11, wherein the second insulator comprises an organic material.

17. The method of claim 16, wherein the second insulator comprises at least one of PI, Parylene, PMMA, Epoxy, PS, PE, PP, PTFE, PPS, PC, PET, PVC, BCB, PVP, PAN, PVA, Phenolic resin, and CVPE.

18. The method of claim 11, wherein the metal substrate comprises at least one of stainless steel, Ti, and Mo.

19. The method of claim 11, wherein disposing the display units comprises disposing a plurality of electroluminescent devices.

20. A flat panel display comprising:
   a flexible conductive substrate having first and second surfaces;
   a display unit on the first surface;
   a second substrate covering the display unit, the second substrate being exposed to ambient conditions;
   an insulator contacting only the flexible conductive substrate among the flexible conductive substrate and the second substrate and covering and directly contacting the second surface and side edges of the flexible conductive substrate,
   wherein the flexible conductive substrate is not exposed to the ambient conditions at least partly due to the insulator.

21. The method of claim 11, further comprising connecting the second substrate to the cut metal substrate.

* * * * *

UNITED STATES PATENT AND TRADEMARK OFFICE
CERTIFICATE OF CORRECTION

| | | |
|---|---|---|
| PATENT NO. | : 8,030,844 B2 | Page 1 of 1 |
| APPLICATION NO. | : 11/407018 | |
| DATED | : October 4, 2011 | |
| INVENTOR(S) | : Hyun-Soo Shin et al. | |

It is certified that error appears in the above-identified patent and that said Letters Patent is hereby corrected as shown below:

At column 5, line 11, please delete "exposed," and insert -- exposed. --, therefor.

At column 8, line 31, claim 20, please delete "substrate" and insert -- substrate, --, therefor.

Signed and Sealed this
Tenth Day of April, 2012

David J. Kappos
*Director of the United States Patent and Trademark Office*